US010672660B2

(12) United States Patent
Inoue et al.

(10) Patent No.: US 10,672,660 B2
(45) Date of Patent: Jun. 2, 2020

(54) METHOD OF MANUFACTURING SEMICONDUCTOR ELEMENT

(71) Applicant: NICHIA CORPORATION, Anan-shi, Tokushima (JP)

(72) Inventors: Naoto Inoue, Anan (JP); Sho Kusaka, Anan (JP); Minoru Yamamoto, Anan (JP); Masayuki Ibaraki, Anan (JP); Hiroaki Tamemoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 147 days.

(21) Appl. No.: 15/902,756

(22) Filed: Feb. 22, 2018

(65) Prior Publication Data

US 2018/0247871 A1 Aug. 30, 2018

(30) Foreign Application Priority Data

Feb. 27, 2017 (JP) ................................ 2017-034721

(51) Int. Cl.

| | |
|---|---|
| ***H01L 21/78*** | (2006.01) |
| ***B23K 26/57*** | (2014.01) |
| ***H01L 33/00*** | (2010.01) |
| ***B23K 26/53*** | (2014.01) |
| *B23K 103/00* | (2006.01) |

(52) U.S. Cl.

CPC .............. *H01L 21/78* (2013.01); *B23K 26/53* (2015.10); *H01L 33/0095* (2013.01); *B23K 2103/56* (2018.08); *H01L 33/007* (2013.01)

(58) Field of Classification Search

CPC ..... H01L 21/78; H01L 33/0095; B23K 26/53; B23K 26/57

See application file for complete search history.

(56) References Cited

U.S. PATENT DOCUMENTS

| | | | | |
|---|---|---|---|---|
| 8,728,916 | B2 * | 5/2014 | Tamemoto | B28D 5/0011 438/463 |
| 9,653,644 | B2 * | 5/2017 | Tamemoto | H01L 33/32 |
| 2004/0002199 | A1 | 1/2004 | Fukuyo et al. | |
| 2005/0173387 | A1 | 8/2005 | Fukuyo et al. | |
| 2005/0181581 | A1 | 8/2005 | Fukuyo et al. | |
| 2005/0184037 | A1 | 8/2005 | Fukuyo et al. | |

(Continued)

FOREIGN PATENT DOCUMENTS

| | | |
|---|---|---|
| JP | 2002-205180 A | 7/2002 |
| JP | 2008-098465 A | 4/2008 |

(Continued)

*Primary Examiner* — Latanya N Crawford

(74) *Attorney, Agent, or Firm* — Global IP Counselors, LLP

(57) ABSTRACT

A method of manufacturing a semiconductor element includes: providing a wafer having a semiconductor layered body on a sapphire substrate; irradiating a laser light in an interior region of the sapphire substrate to create cracks in the sapphire substrate by performing a first scan to irradiate the laser light at a first depth with a first pulse energy to create a first modified region, and a second scan following the first scan to irradiate the laser light at a second depth with a second pulse energy greater than the first pulse energy along and within the first modified region; and dividing the wafer by extending the cracks to obtain a semiconductor element.

16 Claims, 6 Drawing Sheets

(56) References Cited

U.S. PATENT DOCUMENTS

| | | | |
|---|---|---|---|
| 2005/0189330 | A1 | 9/2005 | Fukuyo et al. |
| 2005/0194364 | A1 | 9/2005 | Fukuyo et al. |
| 2006/0040473 | A1 | 2/2006 | Fukuyo et al. |
| 2006/0160331 | A1 | 7/2006 | Fukuyo et al. |
| 2007/0298529 | A1 | 12/2007 | Maeda et al. |
| 2010/0055876 | A1 | 3/2010 | Fukuyo et al. |
| 2010/0176100 | A1 | 7/2010 | Fukuyo et al. |
| 2011/0021004 | A1 | 1/2011 | Fukuyo et al. |
| 2011/0027971 | A1 | 2/2011 | Fukuyo et al. |
| 2011/0027972 | A1 | 2/2011 | Fukuyo et al. |
| 2011/0037149 | A1 | 2/2011 | Fukuyo et al. |
| 2011/0155706 | A1 | 6/2011 | Nagatomo et al. |
| 2012/0190175 | A1 | 7/2012 | Fukuyo et al. |
| 2012/0205357 | A1 | 8/2012 | Fukuyo et al. |
| 2012/0228276 | A1 | 9/2012 | Fukuyo et al. |
| 2012/0279947 | A1 | 11/2012 | Fukuyo et al. |
| 2012/0319138 | A1* | 12/2012 | Fujiwara ................ H01L 33/22 257/79 |
| 2013/0017670 | A1 | 1/2013 | Fukuyo et al. |
| 2013/0040466 | A1 | 2/2013 | Abe |
| 2015/0111365 | A1 | 4/2015 | Fukuyo et al. |
| 2015/0372188 | A1 | 12/2015 | Minakuchi et al. |
| 2016/0228984 | A1 | 8/2016 | Hirata et al. |
| 2017/0098733 | A1* | 4/2017 | Tamemoto ............. H01L 33/32 |
| 2019/0118306 | A1* | 4/2019 | Yuan ..................... B23K 26/06 |

FOREIGN PATENT DOCUMENTS

| | | | |
|---|---|---|---|
| JP | 2011-061129 | A | 3/2011 |
| JP | 2011-131256 | A | 7/2011 |
| JP | 2012-004313 | A | 1/2012 |
| JP | 2012-109358 | A | 6/2012 |
| JP | 2013-105822 | A | 5/2013 |
| JP | 2013-227175 | A | 11/2013 |
| JP | 2016-004951 | A | 1/2016 |
| JP | 2016-042513 | A | 3/2016 |
| JP | 2016-076523 | A | 5/2016 |
| JP | 2016-084275 | A | 5/2016 |
| JP | 2016-129202 | A | 7/2016 |
| JP | 2016-129203 | A | 7/2016 |
| JP | 2016-146447 | A | 8/2016 |
| WO | 2009-128315 | A1 | 10/2009 |

* cited by examiner

METHOD OF MANUFACTURING SEMICONDUCTOR ELEMENT

CROSS-REFERENCE TO RELATED PATENT APPLICATION

This application claims priority to Japanese Patent Application No. 2017-034721 filed on Feb. 27, 2017. The entire disclosure of Japanese Patent Application No. 2017-034721 is hereby incorporated herein by reference.

BACKGROUND

Technical Field

The present disclosure relates to a method of manufacturing a semiconductor element.

Description of Related Art

There have been known a semiconductor element produced by singulating a wafer having semiconductor layers epitaxially growing on a sapphire substrate. In recent years, a major stream of a method of singulating is laser scribing in which a laser light is focused inside a substrate to create a modified region, and a crack initiated and extended from the modified region is used as a start point to divide the wafer.

In the case when the sapphire substrate is thick etc., a complete dividing may not be produced by a single time of scan with laser light. In this case, a plural number of times of scan with laser light may be performed at different focusing depths to create a plural number of modified regions in a dividing direction, as described in, for example, Japanese Unexamined Patent Application Publication Nos. 2008-98465 and 2002-205180.

SUMMARY OF THE INVENTION

In such a method, a wafer is divided using the cracks that extend due to internal stress in the modified region. But, for example, if an excessive internal stress is generated in a sapphire substrate, meandering and/or branching may occur in extending cracks, which may resulting in breaking and/or chipping in the semiconductor element obtained by the dividing. When such a breaking and/or chipping reaches the electrode of the semiconductor element, the semiconductor element is determined as a defective product.

Also, when the crack meandering and/or branching occurs, the lateral surface of the semiconductor element obtained by dividing likely result in a rough surface. When seen from above, such a semiconductor element has a periphery which deviates from the shape based on the locations of modified regions. For example, in a side-view type package used for backlight of a display etc., downsizing has been generally carried out by reducing the distances between the opposite outer lateral surfaces of the package for accommodating the semiconductor element to be slightly greater than the predetermined dimensions of the semiconductor element. In such a case, contacting of a protrusion on a lateral surface of the semiconductor element to the inner lateral surface of the package may hinder placing the semiconductor element in the package.

The embodiments include the aspects described below.

A method of manufacturing a semiconductor element includes: providing a wafer having a semiconductor layered body on a sapphire substrate; irradiating a laser light in an interior region of the sapphire substrate to create cracks in the sapphire substrate by performing a first scan to irradiate the laser light at a first depth with a first pulse energy to create a first modified region, and a second scan following the first scan to irradiate the laser light at a second depth with a second pulse energy greater than the first pulse energy along and within the first modified region; and dividing the wafer by extending the cracks to obtain a semiconductor element.

According to the method of manufacturing a semiconductor element, it is possible to realize highly accurate control of the shape and dimensions of the semiconductor elements.

DETAILED DESCRIPTION OF EMBODIMENTS

Figure 1:
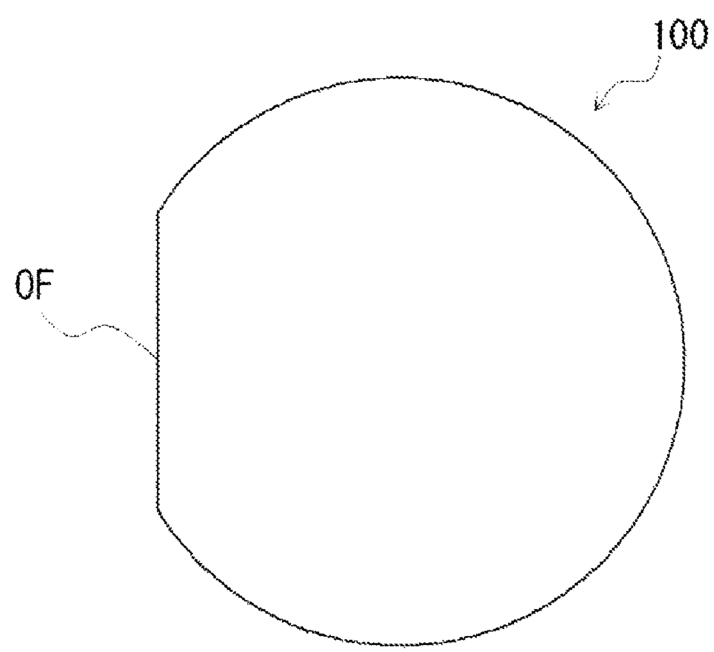
FIG. 1 is a schematic plan view of a wafer used in a method of manufacturing a semiconductor element according to one embodiment of the present invention.

Certain embodiments of the present invention will be described below with reference to the drawings. The preferred embodiments are intended as illustrative of a light emitting device and a method of manufacturing the light emitting device to give a concrete form to technical ideas of the present invention, and the scope of the invention is not limited to those described below. In the description below, the same designations or the same reference numerals denote the same or like members and duplicative descriptions will be appropriately omitted. The sizes and the arrangement relationships of the members in each of drawings are occasionally shown exaggerated for ease of explanation.

Method of Manufacturing Semiconductor Element

A method of manufacturing a semiconductor element according to certain embodiments includes providing a wafer having a semiconductor layered body on a sapphire substrate, irradiating a laser light in an interior region of the sapphire substrate to create a crack in the sapphire substrate, and dividing the wafer using the crack as a start point.

In the method of manufacturing a semiconductor element, the irradiation of the laser light includes a first scan of scan with a laser light at a first depth and a first pulse energy to create a first modified region, and a second scan of scan with a laser light at a second depth and a second pulse energy greater than the first pulse energy along and within the first modified region.

The greater the pulse energy, the greater the extension of a crack, but the greater the pulse energy, the greater the possibility of occurrence of crack meandering and/or branching. This is because a crack created by a single pulse laser irradiation is not completely bilaterally symmetrical and has a deviation which becomes more apparent with increasing pulse energy. One of the causes of such a deviation in the crack is thought due to slight deviation in the dimensions of the optical member and/or the optical axis etc., from its ideal value, which results in occurrence of deviation in the laser spot. The deviations in the cracks differ between laser scribing devices. The smaller the pulse energy, the smaller the crack created by a single laser irradiation, leading to little deviation in the crack and scarcely causing crack meandering and/or branching. On the other hand, the smaller the pulse energy, the smaller the extension of the crack. Without a sufficient extension of the crack, however, dividing of a thick member such as a sapphire substrate can be difficult.

Accordingly, in one embodiment, irradiations with a greater pulse energy and a smaller pulse energy are combined to execute a first scan with a small pulse energy to create a first modified region, and then execute a second scan with a larger pulse energy focusing within the first modified region. When plural times of scans are successively executed, the extending direction of a crack created by a former scan affects the extending direction of a crack created by the following scan. Executing the second scan after executing the first scan, the extending direction of the crack created by the second scan can be directed to extend along the crack that is created by the first scan. Accordingly, executing the first scan and the second scan allows creating a crack extending in a direction approximately similar to the extending direction of the crack created by the first scan and extending into a wider region than the cracks created only by the first scan, while scarcely generating meandering and/or branching. Thus, highly accurate controlling of the shape and size of the semiconductor element obtained by the dividing can be realized. Accordingly, manufacturing of the semiconductor elements can be performed with a good yield.

Providing Wafer

Figure 2:
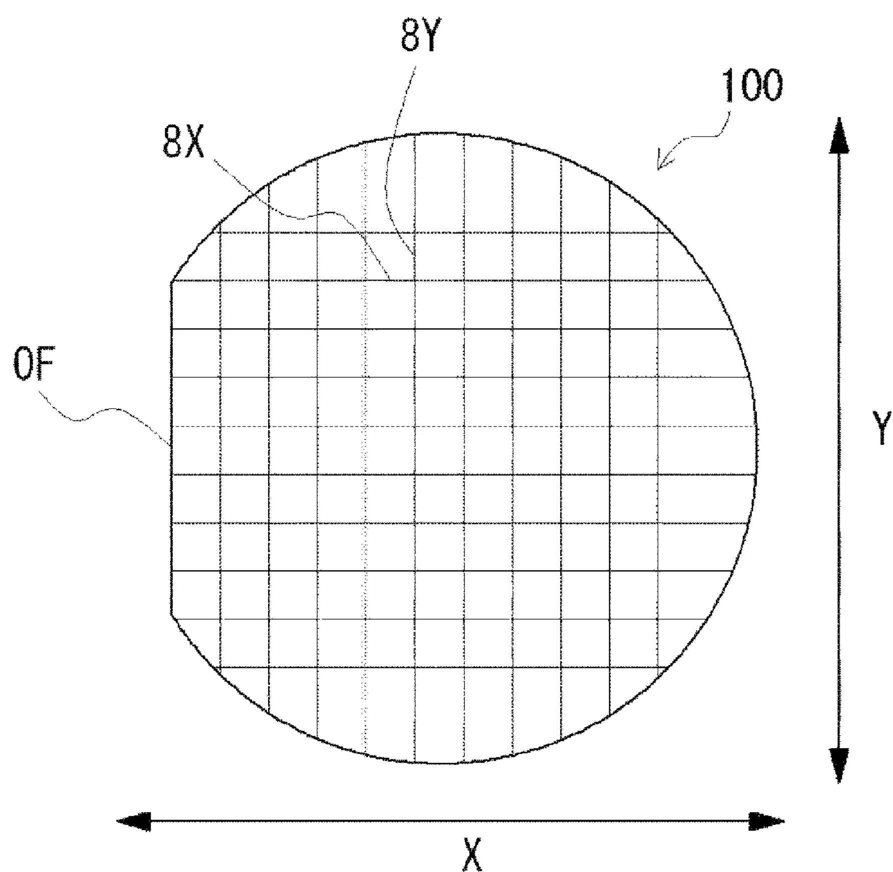
FIG. 2 is a schematic plan view showing dividing lines of the wafer in FIG. 1.
Figure 3:
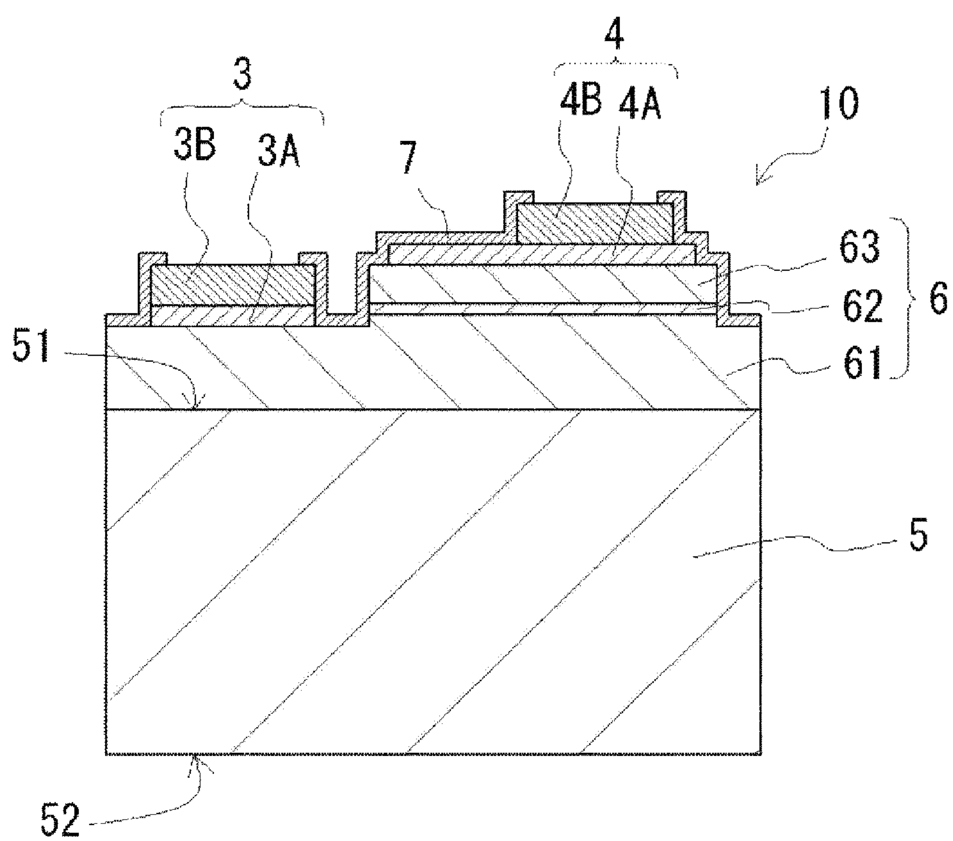
FIG. 3 is a schematic cross-sectional view of a portion corresponding to a single semiconductor element in the wafer shown in FIG. 1.

As shown in FIG. 1 to FIG. 3, a wafer 100 having a semiconductor layered body 6 on a sapphire substrate 5 is provided.

The sapphire substrate 5 has a thickness, for example, in a range of about 50 μm to about 2 mm, preferably in a range of about 50 μm to about 1 mm, more preferably in a range of about 50 μm to about 300 μm. The sapphire substrate 5 is preferably a C-plane sapphire substrate. In this case, an orientation flat (OF) can be A-plane (11-20). The sapphire substrate 5 may have a surface with a plurality of protrusions or recesses. Such a substrate is, for example, described in Japanese Patent No. 5267462.

The sapphire substrate 5 with an off-angle may be used. The off-angle is preferably within one degree.

The semiconductor layered body 6 may have, for example, in order from the sapphire substrate 5 side, an n-side semiconductor layer 61, an active layer 62, and a p-side semiconductor layer 63. The n-side semiconductor layer 61 and the p-side semiconductor layer 63 are generally made of a plurality of n-side semiconductor layers and p-type semiconductor layers, respectively, where one or more undoped layers may be included. The active layer 62 has, for example, a multiquantum well structure or a single quantum well structure. The semiconductor layered body 6 can be epitaxially grown on the sapphire substrate 5. Examples of the materials of the semiconductor layered body include a nitride semiconductor such as a Group III-V compound semiconductor represented by a formula $In_xAl_yGa_{1-x-y}N$, in which $0 \le x$, $0 \le y$, $x+y \le 1$). The light emitted from the light emitting layer 62 has a center wavelength in a range of, for example, 360 nm to 650 nm.

The semiconductor layered body 6 may be provided with an n-electrode 3 and a p-electrode 4 on a same surface side. The p-electrode 3 is connected to the n-side semiconductor layer 61 and the p-electrode 4 is connected to the p-side semiconductor layer 63. The p-electrode 4 includes, for example, a light-transmissive electrically conductive layer 4A in contact with the p-side semiconductor layer 63 and a pad electrode 4B disposed on the light-transmissive electrically conductive layer 4A. The n-electrode 3 may also include a light-transmissive electrically conductive layer 3A and a pad electrode 3B. The n-electrode 3 is disposed such that after disposing the n-side semiconductor layer 61, the light emitting layer 62, and the p-side semiconductor layer 63 on the sapphire substrate 5, a portion of the p-side semiconductor layer 63 and the light emitting layer 62 are partially removed to expose a portion of the n-side semiconductor layer 61, and the n-electrode 3 is disposed on the exposed n-side semiconductor layer 61. The semiconductor layered body 6 is preferably provided with an electrically insulating protective film 7 formed with openings corresponding to predetermined regions for the pad electrodes 3B and 4B.

Irradiation of Laser Light: First Scan and Second Scan

When the laser light is irradiated in the sapphire substrate 5, the two scan is performed in order of the first scan and the second scan. The second scan is performed along and within the first modified region created by the first scan. As used herein, the expression "along and/or within the modified region" indicates that the second scan is performed, when seen from above, to overlap the first modified region created by the first scan. In other words, when seen from above, the first scan path and the second scan path are substantially superimposed.

The first scan and the second scan are, for example, performed along the a-axis direction of the sapphire that is used for the sapphire substrate 5. In this case, the third scan and the fourth scan to be described below are performed along the m-axis direction. Alternatively, the first scan and the second scan may be m-axis direction scan and the third scan and the fourth scan may be a-axis direction scan. When the orientation flat OF is A-plane, "a-axis direction" refers to, as shown in FIG. 2, an X-axis direction perpendicular to the orientation flat OF.

Figure 4A:
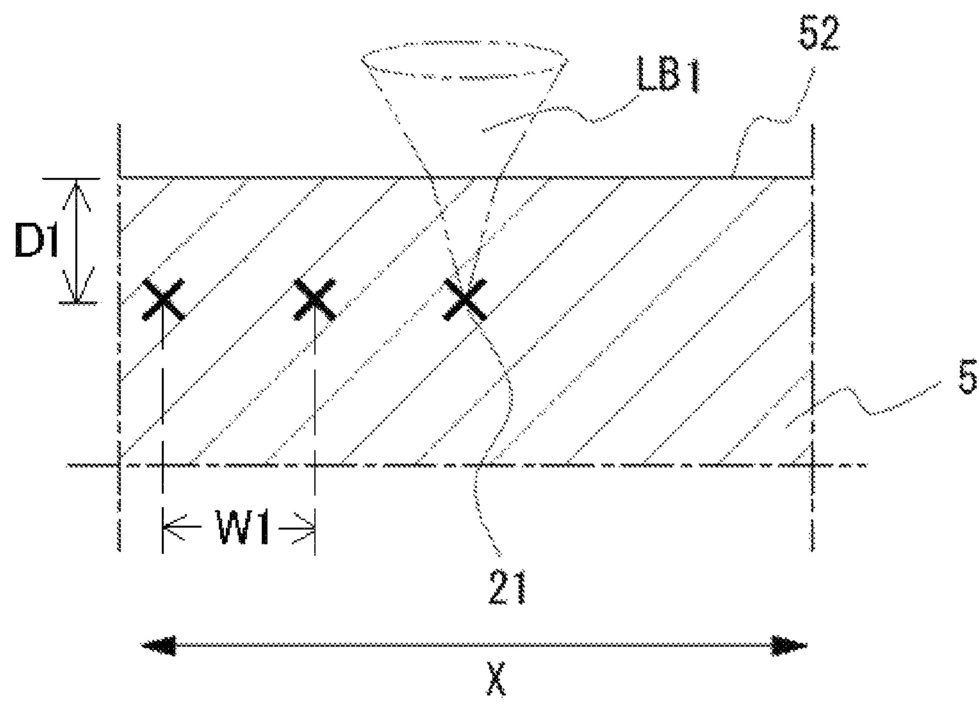
FIG. 4A is a schematic cross-sectional view of a sapphire substrate, illustrating a first scan in the method of manufacturing a semiconductor element according to the embodiment.

As shown in FIG. 4A, the laser light LB1 is irradiated to the sapphire substrate 5 from the back surface 52 side absent of the semiconductor layered body 6 of the sapphire substrate 5, and for example, the first scan in the X-direction is performed. The first scan is performed at a first pulse energy with the focal point position of the laser light LB1 set inside the sapphire substrate 5, that is, at a predetermined depth from the upper surface 51 side or the back surface 52 side of the sapphire substrate 5 (e.g., at a first depth D1 from the back surface 52 side of the sapphire substrate 5).

FIG. 4A shows a first laser spot 21 where the laser light LB1 is condensed at the focal point. FIG. 4A shows a state in which irradiation of the laser light LB1 has been completed at the first laser spots 21 other than the first laser spot 21 with the condensed laser light LB1. The above can be applied in a similar manner in FIG. 4B, FIG. 5A, and FIG. 5B. As described above, in the present specification, the first laser spot 21 during irradiation and the first laser spot 21 after irradiation may be referred simply as the "first laser spot 21".

The energy of the irradiated laser light LB1 induces multiphoton absorption by electrons, in which energy transferred from the excited electrons to the lattices is converted to thermal energy (that is, heat is generated by lattice vibration), influence of heat is exerted around the focused part and an internal stress occurs. This creates a void at a location corresponding to the first laser spot 21. Then, a crack is initiated from the void. The initial cracks from adjacent voids join together and form a modified region extending in a strip along the scan direction of the laser light LB1. With the modified region as a start point, the crack further extends.

The scan of the laser light LB1 is performed approximately in parallel to the back surface 52 of the sapphire substrate 5. That is, the scan is performed so that all the first laser spots 21 of the laser light LB1 are aligned in a straight line substantially in parallel to the back surface 52.

The first depth D1 and the first pulse energy can be appropriately adjusted according to the thickness of the sapphire substrate 5 of the wafer 100. The focal point position of the first scan is preferably close to the laser light LB1 incident side of the surface. Thus, at the time when the crack reaching the back surface 52, the crack has not yet been reached the upper surface 51 and continuing extension toward the upper surface 51. The extension can be accelerated by the second scan. For example, the first depth D1 is less than a half of the thickness of the sapphire substrate 5, more specifically, within 150 μm from the back surface 52 of the sapphire substrate 5, preferably in a range of 10 to 30 μm. The first pulse energy can be in a range of 0.6 to 10 μJ, preferably in a range of 0.6 to 5 μJ, more preferably in a range of 0.6 to 2 μJ. Accordingly, a first crack extending to a degree that allows usage as a guide and scarcely develops meandering and/or branching can be created.

The laser light LB1 is preferably a pulse laser light such as a femtosecond laser or a picosecond laser. For example, the pulse laser light of a pulse width in a range of 100 fsec to 10 psec can be used. The laser light LB1 has a wavelength that can penetrate the sapphire substrate 5. For example, a wavelength in a range of 900 nm to 1100 nm can be selected. Examples of laser that can penetrate the sapphire substrate 5 include a Nd:YAG laser, a Nd:YVO4 laser, an Nd:YLF laser, a titanium-sapphire laser, and a KGW laser. In the first scan, the laser light LB1 is set with a first laser spot 21 having a spot diameter, which is a length in the X-direction, in a range of 1 to 10 μm. More specifically, for example, a laser with a spot diameter of 1.5 μm, a wavelength of 1045 nm, and a pulse width of 1 psec can be used.

With such a scan, a relatively straight crack generally extending in a direction parallel to the sapphire substrate 5 can be created.

Figure 4B:
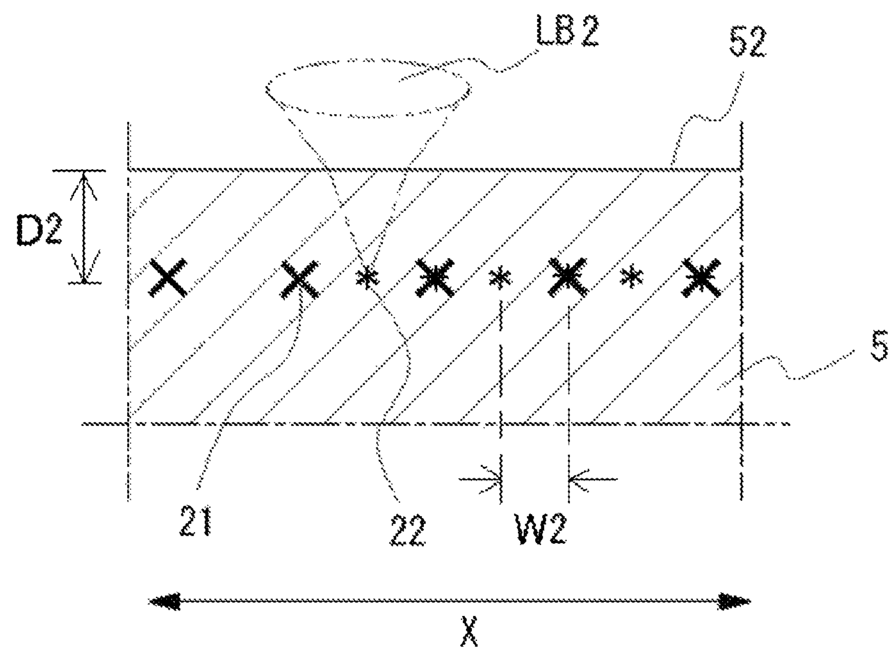
FIG. 4B is a schematic cross-sectional view of the sapphire substrate, illustrating a second scan in the method of manufacturing a semiconductor element according to the embodiment.

After the first scan, the second scan is performed along the modified region created by the first scan, for example, in the X direction, as shown in FIG. 4B. In the second scan, the laser light LB2 is irradiated into the sapphire substrate 5 so as to scan the same part scanned by the first scan. In the present specification, the term "the same part" indicates a part overlapping the corresponding part in a plan view, that is, when the wafer 100 is viewed from above. The first laser spots 21 and the second laser spots 22 in FIG. 4B are shown in different symbols and sizes for ease of illustration that is not indicative of magnitudes of the pulse energies.

The second scan is carried out at a second depth D2 within the first modified region created by the first scan with a second pulse energy greater than the first pulse energy.

The second depth D2 is less than a half of the thickness of the sapphire substrate 5, more specifically, within 150 μm from the back surface 52 of the sapphire substrate 5, preferably in a range of 10 to 30 μm. The second laser spots 22 of the laser light LB2 irradiated in the second scan is set within the first modified region created by the first scan, which can reduce the possibility of the second crack created by the second scan averted from the first crack created by the first scan and resulting in a branched crack. Accordingly, only a single crack can be created corresponding to a single lateral surface of each of the resulting semiconductor elements.

By overlapping the predetermined regions for modified regions to be created in the first scan and the second scan, the modified regions created by the first scan and the second scan can be substantially the same as that created by a single scan. Accordingly, when the semiconductor elements obtained by singulating along the cracks are LEDs, reduction in the optical output due to the modified region can be reduced. For example, when the area of the modified region is greater, light is more easily emitted from the corresponding lateral surface of the sapphire substrate 5, and relatively, light emission from the main surface of the semiconductor element decreases. Reducing the amount of increase in the overall area of the modified regions due to the scans allows facilitating light to be emitted from the main surface of the semiconductor element, which is particularly efficient in a configuration where light emitted from a lateral surface of the semiconductor element is difficult to be extracted to the outside. Examples of such a configuration include a semiconductor element mounted in a side-view type package, a semiconductor element having its one or more lateral surfaces covered by a light-shielding member.

The second depth D2 is preferably the same as the first depth D1. This arrangement can further reduce the possibility of the second scan creating a second crack separated from the first crack created by the first crack to result in a branched crack. When the branched crack occurs, the lateral surface of the semiconductor element obtained by dividing likely result in a rough surface.

The second pulse energy with respect to the first pulse energy is preferably in a range of 110% to 300%. When the second pulse energy was about four times with respect to the first pulse energy, the surface roughness of the surface formed by dividing was greater than that when the second pulse energy is slightly less than two times with respect to the first pulse energy. When the first pulse energy was increased to reduce the difference from the second pulse energy, the surface roughness of the surface was reduced. Thus, the second pulse energy is preferably set to 300% or less with respect to the first pulse energy. With this arrangement, the first pulse energy can be small so as to scarcely cause meandering etc., of the cracks while the second pulse energy can be large to accelerate extension of cracks. More specifically, the second pulse energy can be in a range of 0.66 to 30 μJ, preferably in a range of 0.66 to 15 μJ, more preferably in a range of 0.66 to 6 μJ. The greater the pulse energy, the greater the possibility to cause damage to the semiconductor layered body 6. Thus, the second pulse energy is preferably not greater than 6 μJ.

The greater the thickness of the sapphire substrate 5, the greater the required extending region of the crack. Thus, a greater second pulse energy is preferable, but on the other hand, a greater pulse energy tends to increase the occurrence of meandering etc., of the cracks. Accordingly, when the sapphire substrate 5 is thick, after the first scan and the second scan, an additional scan with a pulse energy greater than the first pulse energy is preferably performed. With such an additional scan, the extending region of the cracks can be increased. The depth of the additional scan is preferably within a range of the modified region created by the first scan and the second scan. This arrangement can reduce the possibility of the additional scan creating a crack separated from the cracks created by the first scan and the second scan to result in a branched crack. Such an additional scan may be performed a plurality of times.

There is a tendency of the greater the thickness of the sapphire substrate 5, the more difficult it is for the crack to extend. Accordingly, when the sapphire substrate has a large thickness that requires an additional scan, the pulse energy of the additional scan and also the second pulse energy are preferably greater than the second pulse energy used when only the first scan and the second scan were required. As described above, the second pulse energy is preferably set to 300% or less with respect to the first pulse energy. The pulse energy of the additional scan(s) is also preferably determined in a range similar to that of the second pulse energy. With the arrangement described above, a wafer having a thick sapphire substrate 5 can also be divided with a small surface roughness of the lateral surfaces of the obtained semiconductor elements. For example, the wafer 100 having the sapphire substrate 5 with a thickness of 250 μm, was able to be divided by the first scan at 1.4 μJ, the second scan at 4.2 μJ, and four additional scans each at 4.2 μJ, performed in this order with the same depth. The wafer 100 similar to that above was also able to be divided by the first scan at 0.8 μJ, the second scan at 1.4 μJ, an additional scan at 2.1 μJ, an additional scan at 2.8 μJ, an additional scan at 3.5 μJ, and an additional scan at 4.2 μJ, performed in this order with the same depth. Thus, such a series of scan may be performed with increasingly larger energy.

When the pulse energy and/or the wavelength of the laser light changes, a degree of extension of the occurring crack differs. Thus, the laser light LB2 of the second scan preferably has the same pulse width, the same wavelength, and the like as those in the first scan.

The first scan and the second scan are preferably performed successively. That is, following the first scan performed from a first end to a second end of the wafer 100, the second scan is performed from the second end to the first end. In the present specification, the expression"(a) first end to (a) second end (of the wafer)" used in a description of scans refers to two points in a scan path overlapping the outline of the wafer when seen from above. Also, the second scan is preferably performed within ten seconds after the first scan. Thus, the scan speed is preferably set to allow a reciprocating scan (i.e., one round-trip scan) along a diameter of the wafer with the first scan and the second scan to complete within 10 seconds. In the present specification, the term "scan speed" refers to a relative speed between the laser light emitting part and the wafer 100. Thus, a "scan speed" in the present specification can include a speed when the laser light emitting part is fixed and the wafer 100 is moved, when the laser light emitting part is moved while the wafer 100 is fixed, or when the laser light emitting part and the wafer 100 are moved.

As shown in FIG. 2, laser scribing to divide the wafer 100 is performed a plurality of times in the first direction X and in the second direction respectively.

In such a scan, performing a plurality of first scans to create a plurality of dividing lines 8X and then performing a plurality of second scans, will require significant length of time to complete the second scans tracing the paths of the first scans. Thus, a single time of the first scan and a single time of the second scan are performed successively. For example, the first scan is performed to create a single dividing line 8X and then the second scan is performed tracing back the dividing line 8X. With such a reciprocating scan, overall scan time from the first scan to the completion of the second scan can be reduced. Also, the second scan is preferably performed within ten seconds after the first scan.

Meanwhile, if the second scan is performed before the crack created by the first scan extending sufficiently, the crack created by the first scan may be difficult to be used as a guide. Thus, in order to obtain sufficient extension of the cracks, it is preferable to provide an appropriate period of time between the first scan and the second scan as in the reciprocating scan described above, rather than performing the second scan immediately after the first scan. In this manner, the second scan is preferably performed 0.1 seconds or more after the first scan.

It is preferable that the first scan is a first a-axis direction scan performed along the a-axis of the sapphire with a first spot interval W1, and the second scan is a second a-axis direction scan performed along the a-axis of the sapphire with a second spot interval W2 that is smaller than the first spot interval W1. As described above, a crack initiated from the location corresponding to the first laser spot 21 extends in the sapphire substrate, which tends to extend in the a-axis direction. When seen from the C-plane side, there are three a-axis directions 60 degrees apart from each other, so that if the first spot interval W1 is too small, cracks extending in a direction other than the scan direction along one of the three a-axis directions may merge with each other. For this reason, the first spot interval W1 is preferably large enough to allow the cracks extending in the scan direction merge with each other. Meanwhile, the second a-axis direction scan is performed to facilitate expansion of the cracks, and therefore, an excessive degree of the second spot interval W2 is preferably avoided. Thus, the second spot interval W2 is preferably smaller than the first spot interval W1. Accordingly, the wafer 100 can be divided along the a-axis direction with good accuracy. More specifically, the second spot interval W2 with respect to the first spot interval W1 is preferably in a range of 20% to 80%. The first spot interval W1 can be, for example, in a range of 5 μm to 15 μm, preferably in a range of 6 μm to 10 μm. The second spot interval W2 can be, for example, in a range of 1 μm to 10 μm, preferably in a range of 2 μm to 6 μm. In the present specification, the term "spot interval" refers to a shortest distance between the centers of two adjacent laser spots. The spot interval can be adjusted by the pulse interval of the irradiating laser light, a feed speed of the wafer 100, or the like.

Irradiation of Laser Light: Third Scan and Fourth Scan

When the laser light is irradiated within the sapphire substrate 5, further two scan of the third scan and the four scan are performed in this order in the same direction or in opposite directions to each other, which are different directions from the first scan direction and the second scan direction. As in the above, the expression "the third scan and the four scan are performed in this order in the same direction or in opposite directions to each other" indicates that the fourth scan is performed along the modified regions created by the third scan.

The third scan and the fourth scan are, for example, performed in a direction along the m-axis of the sapphire that is used for the sapphire substrate 5. When the orientation flat OF is A-plane, "m-axis direction" refers to, as shown in FIG. 2, a Y-direction parallel to the orientation flat OF.

Figure 5A:
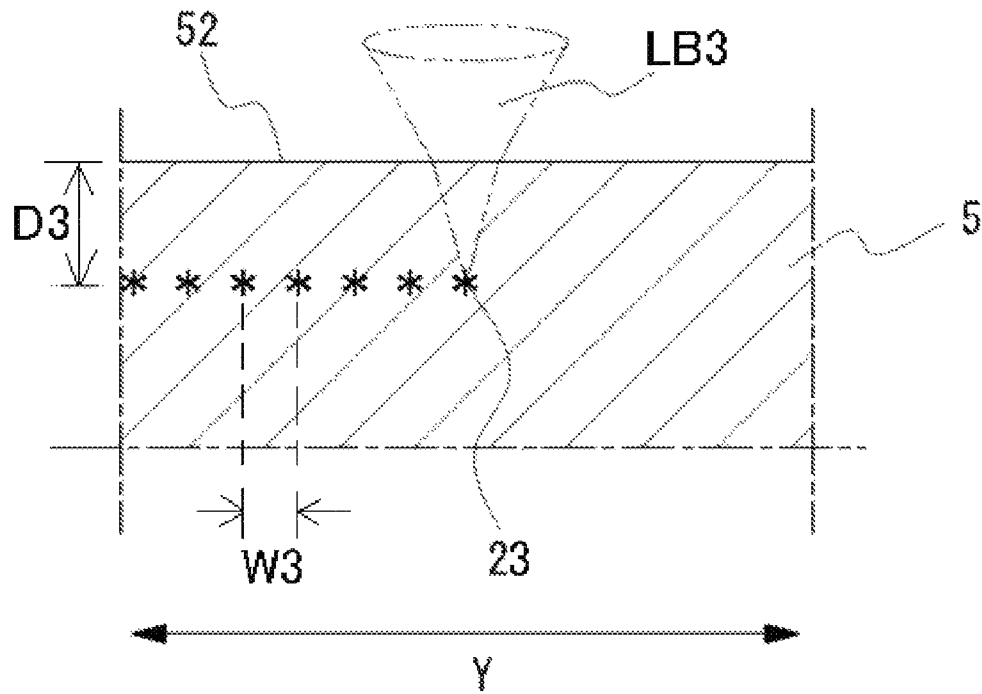
FIG. 5A is a schematic cross-sectional view of the sapphire substrate, illustrating a third scan in the method of manufacturing a semiconductor element according to the embodiment.

As shown in FIG. 5A, the laser light LB3 is irradiated to the sapphire substrate 5 from the back surface 52 side absent of the semiconductor layered body 6 of the sapphire substrate 5, and for example, the third scan in the Y-direction is performed. The third scan is performed at a third pulse energy with the focal point position of the laser light LB3 set in an interior region of the sapphire substrate 5, that is, at a third depth D3 from the upper surface 51 side or the back surface 52 side of the sapphire substrate 5. By this scan, a modified region is created in the sapphire substrate 5.

The scan of the laser light LB3 is performed approximately in parallel to the back surface 52 of the sapphire substrate 5. That is, the scan is performed so that all the laser spots 23 of the laser light LB3 are aligned in a straight line substantially in parallel to the back surface 52.

The conditions to perform the third scan such as the third depth D3, the third pulse energy, and the laser light LB3 can be similar to those used in the first scan.

With such a third scan, a relatively straight crack extending in a direction to the surface of the sapphire substrate 5 can be created as in the first scan.

Figure 5B:
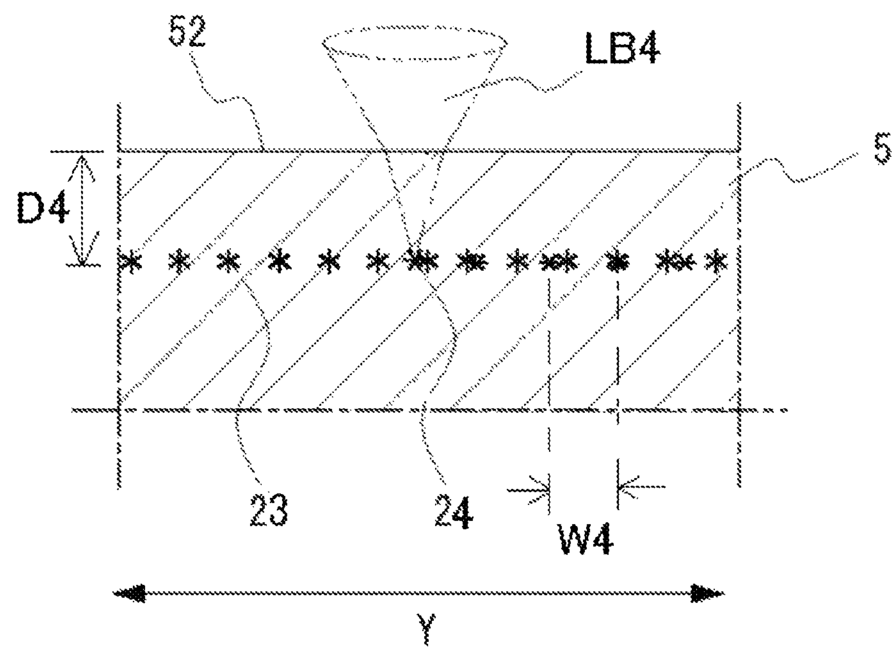
FIG. 5B is a schematic cross-sectional view of the sapphire substrate, illustrating a fourth scan in the method of manufacturing a semiconductor element according to the embodiment.

As shown in FIG. 5B, after the third scan, a fourth scan is performed in Y-direction. In the fourth scan, the laser light LB4 is irradiated into the sapphire substrate 5 so as to scan the same part scanned by the third scan.

The fourth scan is carried out at a fourth depth within the third modified region created by the third scan with a fourth pulse energy greater than the third pulse energy.

The conditions of the fourth scan relative to the conditions of the third scan can be similar to the conditions of the second scan relative to the conditions of the first scan. Also, the conditions to perform the fourth scan such as the fourth depth D4, the fourth pulse energy, and the laser light LB4 can be similar to those used in the second scan. Also, as in the first scan and the second scan, additional scan may be performed in the fourth scan.

The third depth D3 of the third scan and the fourth depth D4 of the fourth scan can be different from the first depth D1 and the second depth D2, but for example substantially the same depths can be used.

In the fourth scan, the laser light LB4 is irradiated to a depth within the third modified region created by the third scan with a pulse energy greater than that of the third scan, thus facilitating extension of the crack created by the fourth scan. That is, the cracks can be extended rectilinearly similar to the cracks created only be the third scan, to a wider region than those created only by the third scan.

Also, as described above, when the laser light is irradiated to substantially the same depth in the third scan and the fourth scan, the distances of the laser spots 23, 24 at each scan from the semiconductor layered body 6 are substantially equal. Thus, the width of the modified region in the thickness direction of the sapphire substrate 5 can be approximately the same as that created only by the third scan. Accordingly, when the semiconductor elements obtained by singulating along the cracks are LEDs, reduction in the optical output due to the modified region can be reduced.

The third scan and the fourth scan are preferably performed successively. That is, following the third scan performed from a third end to a fourth end of the wafer 100, the fourth scan is performed from the fourth end to the third end. In the present specification, the expression"(a) third end to (a) fourth end (of the wafer)" used in a description of scan refers to two points in a scan path overlapping the outline of the wafer when seen from above. Also, the fourth scan is preferably performed within ten seconds after the third scan. Thus, the scan speeds of the third scan and the fourth scan are preferably set to allow a reciprocating scan along a diameter of the wafer 100 with the third scan and the fourth scan to complete within 10 seconds. Accordingly, also in the first scan and the second scan, the modified regions created by the third scan and the fourth scan can be more easily emerged. The fourth scan is preferably performed 0.1 seconds or more after the third scan. Thus, as in the first scan and the second scan, extension of the cracks can be more facilitated.

It is preferable that when the first scan is a first a-axis direction scan and the second scan is a second a-axis direction scan, the third scan is a third m-axis direction scan performed along the m-axis direction of the sapphire with a third spot interval W3, and the fourth scan is a fourth m-axis direction scan performed along the m-axis direction of the sapphire with a fourth spot interval W4. The cracks tend to expand in the a-direction that intersects the m-axis direction at 30°, rather than extend in the m-axis direction. Accordingly, two adjacent laser spots 23 tend to be connected by the cracks extending from each laser spot 23 in the a-axis direction, not by the cracks extending in the scan direction. In such a third m-axis scan, the greater the third spot interval W3, the greater meandering of the cracks when seen from above results. Thus, a smaller third spot interval is preferable. Meanwhile, the fourth m-axis scan is performed to facilitate extension of the cracks, so that the fourth spot interval W4 may not to be as small as the third spot interval W3. Thus, the fourth spot interval W4 is preferably greater than the third spot interval W3. Accordingly, the wafer 100 can be divided along the m-axis direction with good accuracy. More specifically, the fourth spot interval W4 with respect to the third spot interval W3 is preferably in a range of 110% to 300%. The fourth spot interval W4 can be, for example, in a range of 2 μm to 6 μm, preferably in a range of 3 μm to 5 μm. The third spot interval W3 can be, for example, in a range of 0.4 μm to 4.8 μm, preferably in a range of 0.6 μm to 4 μm.

The pulse energy that can create a linear crack in a plan view is approximately the same in the a-axis direction and the m-axis direction, so that the third spot interval W3 is preferably smaller than the first spot interval W1. Accordingly, approximately the same magnitude of the third pulse energy and the first pulse energy can be used to create cracks extending approximately in parallel to the corresponding scan direction in the a-axis direction and the m-axis direction, respectively.

Meanwhile, a crack created by the a-axis direction scan tends to extend obliquely to the back surface 52 than a created by the m-axis direction scan. Considering such an obliquely extending crack, the location to perform the a-axis direction scan is preferably set to a different location from n intended location of dividing. Accordingly, the smallest distance from adjacent bodies of semiconductor elements, for example, in the case of LEDs, from adjacent light emitting layers, is smaller at the focal point position in the a-axis direction scan compared to that at the focal point position in the m-axis direction scan. Thus, the second pulse energy is preferably smaller than the fourth pulse energy. However, reducing the second pulse energy also reduces the influence on extending the crack(s), thus, the second spot interval W2 is preferably smaller than the fourth spot interval W4. With this arrangement, the possibility of damage to the semiconductor element can be reduced, and also similar degree of influence on extending crack(s) can be obtained in the a-axis direction scan and the m-axis direction scan. For example, the second pulse energy can be 1.4 μm, the fourth pulse energy can be 1.5 μm, the second spot interval W2 can be 3 μm, and the fourth spot interval W4 can be 4 μm.

After the a-axis direction scan, the m-axis direction scan that intersects the m-axis direction scan is performed. In this order, predetermined divided surfaces can be likely obtained when dividing the portions having the cracks due to respective scans intersecting with each other, than dividing in reverse order. This tendency becomes more apparent with increasing the distance of the focal point position from the surface opposite from the laser light incident surface, for example the front surface 51, in the sapphire substrate 5. Accordingly, particularly when the sapphire substrate 5 has a large thickness of, for example, 200 μm or greater, the m-axis direction scan is preferably performed after the a-axis scan. As in this case, when the m-axis direction scan is performed after the a-axis scan, crack(s) created by the m-axis scan more hardly extend in the m-axis direction than in reverse order, so that the pulse energy of the m-axis direction scan is preferably greater than that in reverse order.

Dividing Wafer

After irradiating the laser light on the wafer 100 by the first scan and the second scan, the wafer 100 is divided along, for example, the a-axis direction.

When the first scan to the fourth scan are performed, after the laser light is irradiated on the wafer 100 by the first scan to the fourth scan, the wafer 100 is divided, for example, along the a-axis direction and the m-axis direction.

The dividing can be carried out, for example, by pressing a pressing member to break. By such a single breaking operation, both the a-axis direction dividing and the m-axis direction dividing can be carried out. The breaking operation is carried out before the cracks created by the scans reach the surface of the wafer 100, in such a manner that a pressing member is pressed to extend each crack to reach the surface of the wafer 100 to singulate the wafer 100 into individual semiconductor elements. For example, in Example 1 to be described below, the breaking operation was performed when the cracks created by the scans extend to almost reach the surface of the sapphire substrate 5. In this case, pressing by the pressing member is exerted to break the semiconductor layered body 6. The semiconductor layered body 6 has a thickness of, for example, about several micrometers, which is smaller than the thickness of the sapphire substrate 5. Thus, the semiconductor layered body 6 can be singulated by applying a small pressure. When the cracks reach the surface of the wafer 100, the breaking operation to press the pressing member is not needed.

Accordingly, the semiconductor elements singulated at the dividing lines 8X and 8Y as shown in FIG. 2 have a rectangular shape or an approximately rectangular shape, when viewed from above.

Figure 6:
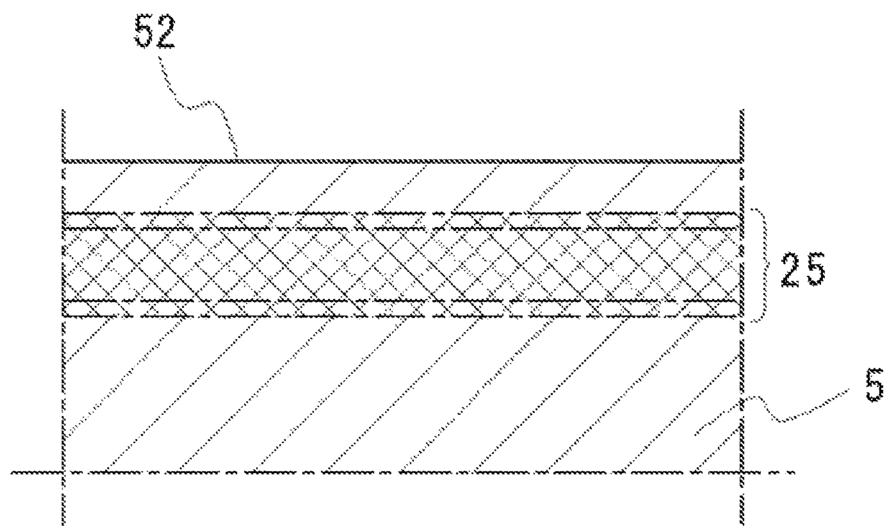
FIG. 6 is a schematic view showing a portion of a lateral surface of the sapphire substrate after being divided.

In the semiconductor elements manufactured as described above, the modified region 25 is formed in a strip extending substantially in parallel to the back surface 52 of the sapphire substrate 5, for example, as in a schematic lateral surface shown in FIG. 6. As described above, the modified region 25 is formed in a strip connecting the portions and its vicinities corresponding to the laser spots of the first scan etc. For example, when the depth of the focal point position from the back surface 52 is 14 μm, the modified region 25 is formed at a depth between 15 μm and 35 μm from the back surface 52 of the sapphire substrate 5. The modified region 25 is a microscopically irregular region. In the lateral surfaces of the sapphire substrate 5, the regions other than the modified region 25 have flatter surfaces than the modified region 25, or have irregular surface with irregular dimension greater than that of the modified region 25. The dividing approximately halves the modified region in the scanning direction. The divided modified region is also referred to as "modified region 25" for the ease of explanation.

As described above, overlapping the second scan on the first scan, and overlapping the fourth scan to the third scan, the dividing accuracy of the wafer 100 can be improved. Accordingly, the surface roughness of the regions other than the modified regions 25 in the lateral surfaces of the obtained semiconductor elements can be reduced. Also, the lateral surfaces of each of the semiconductor elements can be made closer to the planes perpendicular to the back surface 52.

When a semiconductor element such as an LED is produced as the semiconductor element, as described above, avoiding an increase of the width of the modified region 25 can reduce the reduction in the optical output due to the modified region. In the lateral surfaces of the semiconductor elements, the width of the modified region 25 is preferably 50 μm or less, more preferably 30 μm or less. The width of the modified region 25 may be 10 μm or greater, may be 15 μm or greater. The term "width of modified region" refers to a width in the thickness direction of the sapphire substrate 5. The laser spot diameter can be adjusted by the pulse energy and the pulse width of the laser light, the number of apertures (NA) and the depth of focus of the lens that condense the laser light.

In the first scan and the second scan, and in the additional third scan and the fourth scan, the laser light is preferably irradiated to the wafer 100 from a side (i.e., the back surface 52 side) opposite from the side having the semiconductor layered body 6. In this manner, the semiconductor layered body 6 is not present in the path from the laser light emitting part to the focal point position, so that possibility of damage to the semiconductor layered body 6 by the laser light can be reduced. Further, the focal point position of the laser light is preferably set to a location in the sapphire substrate 5 that is closer to the back surface 52 than to the upper surface 51. In other words, the distance between the focal point positions of the laser light to the upper surface 51 is preferably greater than the distance between the focal point position of the laser light to the back surface 52. Thus, setting the focal point position of the laser light away from the semiconductor layered body 6 allows for a further reduction possibility of damage to the semiconductor layered body 6 by the laser light. More specifically, the depth of the focal point position of the laser light is preferably set so that the modified region 25 is formed in a range ⅕ to ⅖ of the thickness from the back surface 52 of the sapphire substrate 5.

Example 1

In Example 1, an LED was produced as the semiconductor element. A wafer 100 having a semiconductor layered body 6 made of nitride semiconductors such as GaN, AlGaN, and InGaN disposed on a C-plane that is an upper surface of a sapphire substrate 5 was provided. The sapphire substrate 5 has a thickness of 150 μm.

Then, laser scribing was performed.

More specifically, from the back surface 52 side of the sapphire substrate 5, that is, from the side opposite to the side having the semiconductor layered body 6, the laser light was successively irradiated along the m-axis direction of the sapphire of the sapphire substrate 5 as the first m-axis direction scan and as the second m-axis direction scan. The laser light with a pulse width of 1 psec and a wavelength of 1045 nm was used. The laser light was condensed in an interior region of the sapphire substrate 5 by using a lens with NA 0.8.

The m-axis direction scan was performed, then, the a-axis direction scan was performed. In Example 1, for the a-axis direction scan, a first a-axis scan and a second a-axis scan with larger pulse energy and smaller spot interval than those of the first a-axis direction scan were performed. The conditions are shown below. The "depth" indicates a distance of the laser spot from the back surface 52 of the sapphire substrate 5, and the "speed" indicates a feed speed of the wafer.

| Example 1 a-axis | Depth (Focus: μm) | Pulse Energy (μJ) | Spot Interval (μm) | Speed (mm/s) | Frequency (kHz) |
|---|---|---|---|---|---|
| First a-axis Scan | 18 | 1.2 | 6 | 600 | 100 |
| Second a-axis Scan | 18 | 2 | 3 | 300 | 100 |

After performing the first scan and the second scan along the a-axis direction, breaking was performed along the m-axis direction and the a-axis direction and individual semiconductor elements were obtained.

Then, irregularity of the divided surface of one of the semiconductor elements along the a-axis were measured from the modified region 25 to the back surface 52 by using a laser microscope, and the surface roughness was calculated, thus obtained an arithmetical mean roughness Ra of 0.18 μm, and a ten-point average roughness Rz of 1.63 μm.

Comparative Examples 1 to 3

In Comparative Examples 1 and 2, two wafers similar to those in Example 1 were used to carry out m-axis direction scans and a-axis direction scans. A first scan and a second scan in the a-axis direction were respectively carried out with conditions shown below, which were different from the conditions in Example 1. As seen from the conditions shown below, in Comparative Example 1 and Comparative Example 2, the same pulse energy and the spot interval are employed, which are different from those in Example 1. Comparative Example 1 is also different from Example 1, in which the focal point position of the second scan is at a shallower location than the focal point position of the first scan. After performing the breaking, irregularity of the divided surfaces along the a-axis were measured in a same manner as in Example 1.

| | Depth (Focus: μm) | Pulse Energy (μJ) | Spot Interval (μm) | Speed (mm/s) | Frequency (kHz) |
|---|---|---|---|---|---|
| Comparative Example 1 a-axis | | | | | |
| First Scan | 29 | 1.6 | 3 | 300 | 100 |
| Second Scan | 14 | 1.6 | 3 | 300 | 100 |

-continued

| | Depth (Focus: μm) | Pulse Energy (μJ) | Spot Interval (μm) | Speed (mm/s) | Frequency (kHz) |
|---|---|---|---|---|---|
| Comparative Example 2 a-axis | | | | | |
| First Scan | 18 | 1.6 | 3 | 300 | 100 |
| Second Scan | 18 | 1.6 | 3 | 300 | 100 |

The divided surface of Comparative Example 1 along the a-axis exhibited an arithmetical mean roughness Ra of 1.09 μm and an average ten-point average roughness Rz of 4.96 μm.

The divided surface of Comparative Example 2 along the a-axis exhibited an arithmetical mean roughness Ra of 0.80 μm and an average ten-point average roughness Rz of 4.10 μm.

In Comparative Example 3, a wafer similar to that in Example 1 was used to carry out m-axis direction scans and a-axis direction scans. A first scan and a second scan in the a-axis direction were respectively carried out with conditions shown below, which were different from the conditions in Example 1. Then, in a similar manner as in Example 1, a divided surface along the a-axis is observed and the surface unevenness was measured in a similar manner as in Example 1. As can be seen from the conditions shown in the table below, in Comparative Example 3, the first a-axis direction scan and the second a-axis direction scan as in Example 1 were performed in reverse order.

| Comparative Example 3 a-axis | Depth (Focus: μm) | Pulse Energy (μJ) | Spot Interval (μm) | Speed (mm/s) | Frequency (kHz) |
|---|---|---|---|---|---|
| First Scan | 18 | 2 | 3 | 300 | 100 |
| Second Scan | 18 | 1.2 | 6 | 600 | 100 |

The divided surface of Comparative Example 3 along the a-axis exhibited an arithmetical mean roughness Ra of 0.87 μm and an average ten-point height Rz of 4.01 μm.

Example 2

In Example 2, a wafer similar to that in Example 1 except that the thickness of the sapphire substrate 5 was 120 μm was used to carry out the first scan and the second scan in the m-axis direction and the first scan and the second scan in the a-axis direction. The m-axis direction scan and the a-axis direction scan were respectively performed such that the first scan was performed and then the second scan was performed reciprocating the path of the first scan. The duration of time from the start point of the first scan to the end point of the second scan in each of the dividing lines was set to less than one second.

| | Depth (Focus: μm) | Pulse Energy (μJ) | Spot Interval (μm) | Speed (mm/s) | Frequency (kHz) |
|---|---|---|---|---|---|
| m-axis | | | | | |
| First Scan | 14 | 0.8 | 3 | 300 | 100 |
| Second Scan | 14 | 1.4 | 3.5 | 300 | 100 |
| a-axis | | | | | |
| First Scan | 14 | 0.8 | 5.5 | 550 | 100 |
| Second Scan | 14 | 1.4 | 3 | 300 | 100 |

After each scan was performed, before performing the breaking, observation under optical microscope was performed on the back surface side of the sapphire substrate 5, to portions having the first m-axis direction scan and the second m-axis direction scan, and to portions having the first a-axis direction scan and the second a-axis direction scan.

Comparative Examples 4 and 5

In Comparative Examples 4 and 5, two wafers similar to those in Example 2 were used to carry out m-axis direction scans and a-axis direction scans. As seen from the conditions shown below, in Comparative Examples 4 and 5, the same pulse energy and the spot interval are employed, which are different from those in Example 2. Comparative Example 4 is also different from Example 2, in which the focal point position of the second scan is at a shallower location than the focal point position of the first scan.

| | Depth (Focus: μm) | Pulse Energy (μJ) | Spot Interval (μm) | Speed (mm/s) | Frequency (kHz) |
|---|---|---|---|---|---|
| Comparative Example 4 m-axis | | | | | |
| First Scan | 25 | 1.2 | 3 | 300 | 100 |
| Second Scan | 14 | 1.2 | 3 | 300 | 100 |
| Comparative Example 4 a-axis | | | | | |
| First Scan | 25 | 1.2 | 5.5 | 550 | 100 |
| Second Scan | 14 | 1.2 | 5.5 | 550 | 100 |
| Comparative Example 5 m-axis | | | | | |
| First Scan | 14 | 1.4 | 3 | 300 | 100 |
| Second Scan | 14 | 1.4 | 3 | 300 | 100 |
| Comparative Example 5 a-axis | | | | | |
| First Scan | 14 | 1.4 | 3 | 300 | 100 |
| Second Scan | 14 | 1.4 | 3 | 300 | 100 |

In Comparative Examples 4 and 5, as in Example 2, observation under optical microscope was performed on the back surface side of the sapphire substrate prior to breaking. The cracks created by the m-axis direction scan and to the a-axis direction scan in Comparative Examples 4 and 5 exhibited occurrence of meandering and/or branching of cracks more than those created by the scans in Example 2.

From the results shown above, it was confirmed that the methods according to Examples 1 and 2 can provide a semiconductor element with substantially smooth divided surfaces with little irregularities.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a semiconductor element comprising:

providing a wafer having a semiconductor layered body on a sapphire substrate;

irradiating a laser light in an interior region of the sapphire substrate to create cracks in the sapphire substrate by performing a first scan to irradiate the laser light at a first depth with a first pulse energy to create a first modified region, and a second scan following the first scan to irradiate the laser light at a second depth with a second pulse energy greater than the first pulse energy along and within the first modified region, the first scan and the second scan being carried out along an a-axis of sapphire used for the sapphire substrate, the first scan being a first a-axis direction scan with a first spot interval, and the second scan being a second a-axis direction scan with a second spot interval that is smaller than the first spot interval; and dividing the wafer by extending the cracks to obtain a semiconductor element.

2. The method of manufacturing a semiconductor element according to claim 1, wherein the second pulse energy with respect to the first pulse energy is in a range of 110% to 300%.

3. The method of manufacturing a semiconductor element according to claim 1, wherein the first scan and the second scan are carried out along a m-axis of sapphire used for the sapphire substrate.

4. The method of manufacturing a semiconductor element according to claim 1, wherein the second spot interval with respect to the first spot interval is in a range of 20% to 80%.

5. The method of manufacturing a semiconductor element according to claim 1, wherein the irradiating of the laser light further includes performing a first m-axis direction scan to irradiate the laser light at a third depth along a m-axis of the sapphire with a third spot interval and a third pulse energy to create a third modified region, and a second m-axis direction scan following the first m-axis direction scan to irradiate the laser light at a fourth depth along the m-axis within a third modified region with a fourth spot interval and a fourth pulse energy greater than the third pulse energy.

6. The method of manufacturing a semiconductor element according to claim 5, wherein the fourth spot interval is greater than the third spot interval.

7. The method of manufacturing a semiconductor element according to claim 5, wherein the third spot interval is smaller than the first spot interval.

8. The method of manufacturing a semiconductor element according to claim 5, wherein the first a-axis direction scan and the second a-axis direction scan are successively carried out such that the first a-axis direction scan is carried out from a first end to a second end of the wafer and the second a-axis direction scan is carried out from the second end to the first end of the wafer, and before or after the first a-axis direction scan and the second a-axis direction scan are carried out, the first m-axis direction scan and the second m-axis direction scan are successively carried out such that the first m-axis direction scan is carried out from the first end to the second end of the wafer and the second m-axis direction scan is carried out from the second end to the first end of the wafer.

9. The method of manufacturing a semiconductor element according to claim 5, wherein the second a-axis direction scan is performed within 10 seconds after the first a-axis direction scan, and the second m-axis direction scan is performed within 10 seconds after the first m-axis direction scan.

10. The method of manufacturing a semiconductor element according to claim 5, wherein scan speeds of the first a-axis direction scan, the second a-axis direction scan, the first m-axis direction scan, and the second m-axis direction scan are respectively set to allow a reciprocating scanning along a diameter of the wafer to complete within 10 seconds.

11. The method of manufacturing a semiconductor element according to claim 5, wherein the fourth spot interval with respect to the third spot interval is in a range of 110% to 300%.

12. The method of manufacturing a semiconductor element according to claim 5, wherein the forth pulse energy with respect to the third pulse energy is in a range of 110% to 300%.

13. The method of manufacturing a semiconductor element according to claim 5, wherein the second pulse energy is smaller than the fourth pulse energy, and the second spot interval is smaller than the fourth spot interval.

14. The method of manufacturing a semiconductor element according to claim 5, wherein the first pulse energy, the second pulse energy, the third pulse energy, and the fourth pulse energy are respectively within a range of 0.6 μJ to 10 μJ.

15. The method of manufacturing a semiconductor element according to claim 5, wherein a pulse width of the laser light respectively used in the first a-axis direction scan, the second a-axis direction scan, the first m-axis direction scan, and the second m-axis direction scan is in a range of 100 fsec to 10 psec.

16. A method of manufacturing a semiconductor element comprising:

providing a wafer having a semiconductor layered body on a sapphire substrate;

irradiating a laser light in an interior region of the sapphire substrate to create cracks in the sapphire substrate by performing a first scan to irradiate the laser light at a first depth with a first pulse energy to create a first modified region, and a second scan following the first scan to irradiate the laser light at a second depth with a second pulse energy greater than the first pulse energy along and within the first modified region, the first scan and the second scan being carried out along an m-axis of sapphire used for the sapphire substrate, the first scan being a first m-axis direction scan with a first spot interval, and the second scan being a second m-axis direction scan with a second spot interval that is smaller than the first spot interval; and dividing the wafer by extending the cracks to obtain a semiconductor element.

* * * * *